(12) United States Patent
Yashiro

(10) Patent No.: US 7,525,817 B2
(45) Date of Patent: Apr. 28, 2009

(54) WIRING LAYOUT OF AUXILIARY WIRING PACKAGE AND PRINTED CIRCUIT WIRING BOARD

(75) Inventor: Akira Yashiro, Atsugi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/031,018

(22) Filed: Jan. 10, 2005

(65) Prior Publication Data
US 2005/0121228 A1    Jun. 9, 2005

Related U.S. Application Data

(62) Division of application No. 10/395,225, filed on Mar. 25, 2003, now Pat. No. 6,862,192.

(30) Foreign Application Priority Data

Mar. 25, 2002    (JP)    ............................. 2002-084423

(51) Int. Cl.
*H05K 1/11* (2006.01)
*H05K 1/14* (2006.01)
(52) U.S. Cl. ..................... 361/803; 361/793; 361/794; 174/259; 174/260
(58) Field of Classification Search ......... 361/767–768, 361/790–795, 803; 174/258–262; 257/686–724
See application file for complete search history.

(56) References Cited

U.S. PATENT DOCUMENTS 5,574,630 A    11/1996    Kresge et al.
5,847,936 A *  12/1998    Forehand et al. ............ 361/794
6,104,088 A *  8/2000     Hatano et al. ................ 257/698
6,392,296 B1   5/2002     Ahn et al.
6,657,292 B2 * 12/2003    Watanabe .................... 257/697

FOREIGN PATENT DOCUMENTS

| JP | 8-288658 | 11/1996 |
| JP | 2001-339170 | 12/2001 |

* cited by examiner

*Primary Examiner*—Tuan T Dinh
(74) *Attorney, Agent, or Firm*—Oblon, Spivak, McClelland, Maier & Neustadt, P.C.

(57) ABSTRACT

A printed circuit board wiring system including a printed wiring circuit board having a plurality of conductive layers, at least one electronic part mounted on one side of the circuit board and configured to output signals via signal lines, and an auxiliary wiring package mounted on the other side of the circuit board and including a plurality of conductive layers configured to allow the signal lines from the electronic part to pass therethrough so as to be connected to the circuit board. Further, a first set of signal lines are immediately drawn from the at least one electronic part using half of the plurality of conductive layers of the circuit board without passing through the auxiliary wiring package, and a second set of signal lines are drawn from the at least one electronic part through the circuit board and the auxiliary wiring package using the other half of the plurality of conductive layers of the circuit board.

4 Claims, 3 Drawing Sheets

WIRING LAYOUT OF AUXILIARY WIRING PACKAGE AND PRINTED CIRCUIT WIRING BOARD

CROSS REFERRENCE TO A RELATED APPLICATION

This application is a divisional of co-pending U.S. patent application Ser. No. 10/395,225, filed Mar. 25, 2003, which is based upon and claims priority under 35 USC §119 to Japanese Patent Application No. 2002-084423 filed on Mar. 25, 2002, the entire contents of which are hereby incorporated by reference.

BACKGROUND OF THE INVENTION

1. Field of the Invention

The present invention relates to a wiring layout on an auxiliary wiring package that only includes wiring lines and external pads, and also relates to a printed circuit wiring board.

2. Description of the Related Art

Recently, the density of BGA (Ball Grid Array), CSP (Chip Scale Package), etc., mounted on a semiconductor integrated circuit has significantly increased in accordance with the demand for multiple pins (signal lines) and for reducing the size of the circuit. Thus, wiring on the printed circuit wiring board is crowded making it difficult to place wiring between plural locations in a prescribed area. To resolve the above-mentioned problem, a auxiliary wiring package capable of temporary bypassing and drawing out wiring lines has been proposed by the present applicant as described in Japanese Patent application Laid Open No. 11-68026.

Further, because the circuit board has been advanced since the time of filing the Japanese Patent application (i.e., 1998), mass production thereof is performed using a built-up construction method. However, this example increase the total cost for a printed circuit wiring board. Further, placing wiring between plural locations on the printed circuit wiring board is still difficult using the above-noted built-up technology.

In addition, planning a wiring layout using a wiring auxiliary package is more complex than planning a conventional wiring layout.

Further, according to the above-mentioned technology, to easily draw wiring from external pads located at a center of the package and to partially reduce the density of wiring at a predetermined location, a auxiliary wiring package including only wiring lines and external pads (i.e., excluding a semiconductor integrated circuit) is oppositely arranged to an electronic part (IC) attached below the printed circuit wiring board. A plurality of through holes are also formed at predetermined positions through the wiring board that correspond to external pad lines formed at a center of a multiple pin package of the electronic part. External pad lines are also formed at the center and outside sections of the auxiliary package, so that the wiring between the outside and central external pad lines are drawn within the auxiliary wiring package. However, a wiring layout using the auxiliary package is not specifically addressed, and the total cost for the printed circuit wiring board increases.

SUMMARY OF THE INVENTION

Accordingly, an object of the present invention is to solve the above and other problems and provide a novel print circuit board wiring system.

To achieve these and other objects, the present invention provides a printed circuit board wiring system including a printed wiring circuit board having a plurality of conductive layers, at least one electronic part mounted on one side of the circuit board and configured to output signals via signal lines, and an auxiliary wiring package mounted on the other side of the circuit board and including a plurality of conductive layers configured to allow the signal lines from the electronic part to pass therethrough so as to be connected to the circuit board. Further, a first set of signal lines are immediately drawn from the at least one electronic part using half of the plurality of conductive layers of the circuit board without passing through the auxiliary wiring package, and a second set of signal lines are drawn from the at least one electronic part through the circuit board and the auxiliary wiring package using the other half of the plurality of conductive layers of the circuit board.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
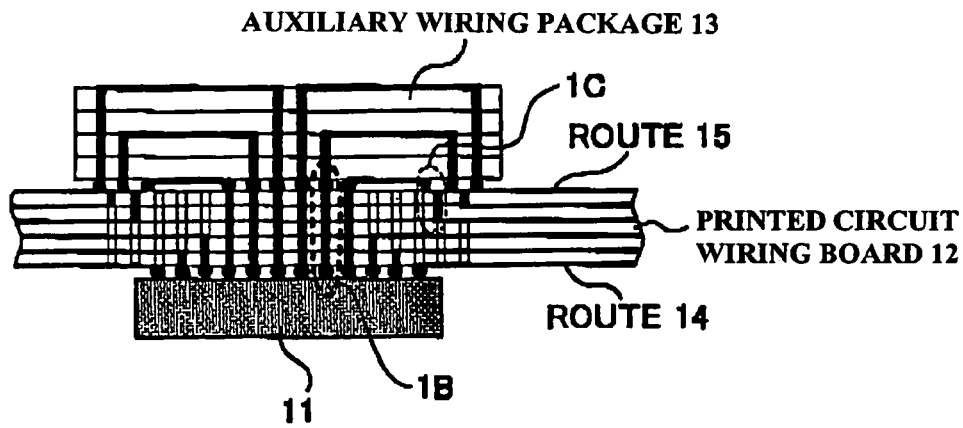
FIG. 1A is a cross sectional view illustrating a first embodiment of a layout on an auxiliary wiring package and a printed circuit wiring board.

Referring now to the drawings, wherein like reference numerals designate identical or corresponding parts throughout several views, and in particular FIG. 1A illustrates a first example of an auxiliary wiring package. As shown, the auxiliary wiring package 13 is arranged on an opposite side of a printed circuit wiring board 12 having an IC (Integrated circuit) 11 as an example of an electronic part mounted on the other side.

Figure 1B:
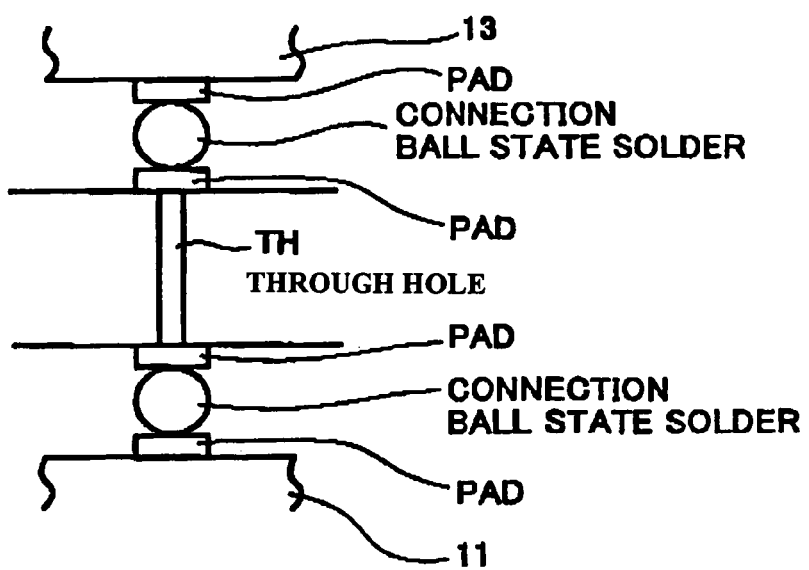
FIG. 1B is an enlarged cross sectional view illustrating one example of a connection of pads and a through hole (via hole) illustrated in FIG. 1A.
Figure 1C:
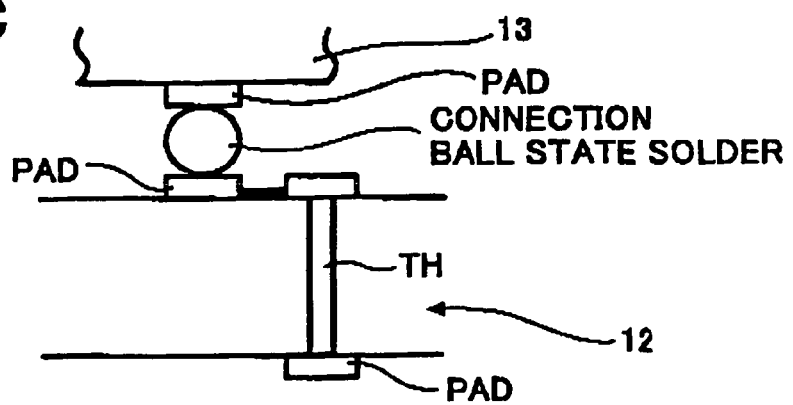
FIG. 1C is an enlarged cross sectional view illustrating another example of a connection of pads and a through hole (via hole) illustrated in FIG. 1A.

That is, the printed circuit wiring board 12 is sandwiched by the auxiliary wiring package 13 and the electronic part (e.g. BGA) 11 having pads thereon (see FIGS. 1B and 1C). The printed circuit board 12 is configured such that a first set of wiring lines are drawn from the IC 11 through one half and a second set of wiring lines are drawn through the other half.

Specifically, as illustrated in FIG. 1, drawn wiring lines of the left side of the vertical center are folded in the left side of the auxiliary wiring package 13, and lead to the surface of the circuit board 12 through plural "VIAs" (i.e., through holes) formed through the circuit board 12. Further, drawn wiring lines of the right side of the vertical center are folded in the right side of the auxiliary wiring package 13, and lead to the surface of the circuit board 12 through VIAs formed through the circuit board 12.

In addition, plural routes of drawn lines starting from pads of the IC 11 are formed as follows. Specifically, as shown in FIG. 1A, outside pads of the IC 11 are immediately led to layers of the circuit board 12 through routes 14 (including VIAs), respectively. That is, the wiring lines from the outside pads do not pass through the auxiliary wiring package 13. Further, as shown, wiring lines from central pads of the IC 11 are led to layers of the auxiliary package 13 through VIAs, and are then drawn to the layers of the printed circuit wiring board 12 through routes 15 formed on and in the auxiliary package 13.

Thus, because the layers of printed circuit wiring board 12 are divided into substantially equal halves (i.e., divided at the middle portion), a guideline for laying out the wiring is easily understood and efficient. Thus, incorrect wiring and the number of man-hours is reduced. For example, when the number of wiring lines immediately drawn from the electronic parts 11 to the circuit board 12 is the same as that of wiring lines drawn through the auxiliary package 13, the wirings can be symmetrically performed about a center layer of the circuit board 12. Thus, if one side is wired, the remaining other side can be wired by copying the former in a mirror state, thereby efficiently completing the wiring process.

Further, as shown in FIG. 1A, the size of the wiring auxiliary package 13 is larger than that of the IC 11. Thus, wiring lines can be easily drawn from the IC 11 through the enlarged auxiliary package 13. Specifically, the number of drawing lines can be infinitely increased in accordance with an increase in the size of the circuit board 12.

A second embodiment of a wiring layout on an auxiliary package and a printed circuit wiring board is illustrated with reference to FIG. 2. As shown, an IC 21 and an auxiliary wiring package 23 each having a relatively large scale are employed. A printed circuit wiring board 22 is sandwiched by the IC 21 (e.g., BGA) and auxiliary package 23. Further, outside plural pins (i.e., signal lines) of the IC 21 having pads are drawn to inner layers of the circuit board 22 in such a manner that most outside pins (pads) of the IC 21 correspond to the layer closest to the parts mounting surface of the circuit board 22. Further, the part of the circuit board 22 not used to draw lines is used to draw lines from the auxiliary package 23. In addition, the size of the IC 21 is substantially the same as the auxiliary package 23.

In addition, drawn wiring from the auxiliary package 23 only occupies a surface of the circuit board 22 having the auxiliary package 23 mounted thereon. Thus, because only the surface layer remains, a guideline for a layout is easily understood. In addition, when outside signal lines (i.e., pins) of the IC 21 are drawn to the inner layers of the circuit board 22, in a manner such that most of the outside pins of the IC 21 corresponds to the layer closest to the IC 21 mounting surface, and/or drawing is performed through penetrating holes formed through the circuit board 22 instead of interstitial via holes (IVHs), line drawing is also efficient.

A configuration of the printed circuit wiring board 22 is described as follows:
  Number of layers: four
  Diameter of PAD: 0.6 mm
  Diameter of surface layer VIA land: 0.5 mm
  Diameter of inner layer VIA land: 0.76 mm
  Line width/Space 0.1 mm/0.1 mm
  Solder registration position precision: ±0.075 mm A configuration of the auxiliary package 23 is similar to that of a printed circuit wiring board 22.

A configuration of the IC 21 is as follows:
  30 lines multiples 30 lines (i.e., 900 pins, 900 signal lines, Full-grid arrangement)
  Pitch between pads: 1.27 mm Further, by using the first to third layers of the circuit board 22, the outside six lines can be drawn through routes 24 originated from the IC 21 to the circuit board 22 (e.g., a number of the outside six drawing lines: 30×6×4−6×6×4=576 pins, with 324 pins remaining).

Figure 2:
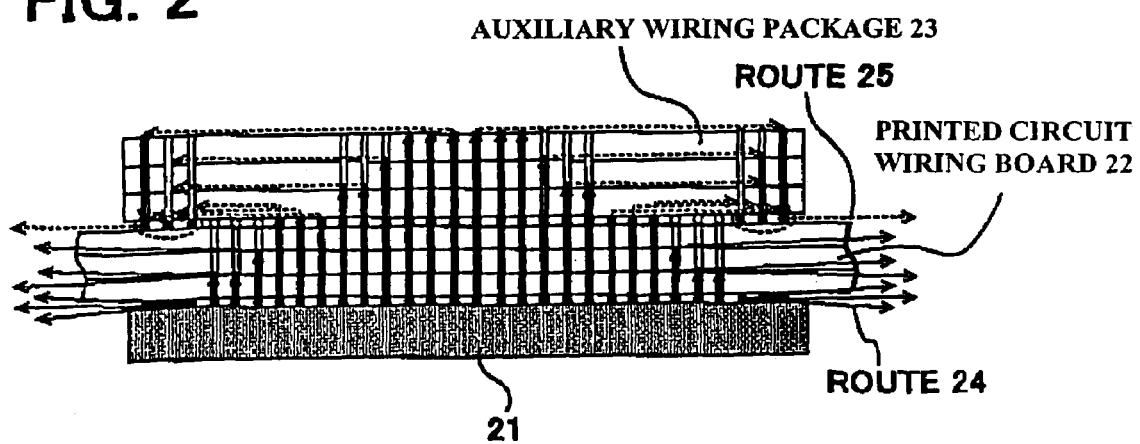
FIG. 2 is a cross sectional view illustrating a second embodiment of a layout on an auxiliary wiring package and a printed circuit wiring board.

Further, the layer having the auxiliary package 23 mounted thereon is reserved for drawing lines from the auxiliary package 23 to the circuit board 22 (e.g., as shown by the outside dotted circles in FIG. 2).

In addition, the number of pads remaining around the center of the IC 21 is 324 pins (e.g., 30−6×2−18 lines: Full-grid) 324-pins of 18 central lines on the IC 21 are drawn to 18 central lines (i.e., 324-pins) on the auxiliary package 23 through the plurality of VIAs of the circuit board 22. Drawing nine lines in one direction from the central to outside pads of the auxiliary package 23 is performed using the 1st to 4th layers (e.g., a total 18 lines: 324-pins). When 324-pins are to be drawn to the circuit board 22 using the outside pads of the auxiliary package 23, the outside three lines (e.g., 30×3×4−3×3×4=324 pins) are sufficient. The outside three lines can be drawn using only the surface layer of the circuit board 22.

As mentioned above, the entire signals of the 900 pins can be drawn from the pads of the IC 21 through the routes 24 and the routes 25 originated from the printed circuit wiring board 22 through the auxiliary package 23 (324 pins of 18 central lines of the IC 21 are drawn through the auxiliary package 23).

According to this embodiment, an occupation rate of a space capable of wiring can be efficiently increased in the circuit board. Further, even when only penetration holes, build-up or the like is used instead of interstitial via holes, line drawing can be efficiently performed. In addition, a layout can be easily understood, and a comprehensive wiring rule can be established. Also, when a general purpose auxiliary package is used in accordance with an external shape and a number of pins of an electronic part having an under face pad, the setting of the auxiliary package can be performed by a supplier as well as at user sites.

A third embodiment of a wiring layout on an auxiliary wiring package and a printed circuit wiring board is now described with reference to FIG. 3. As shown, a circuit wiring board 32 is sandwiched by the auxiliary package 33 and electronic part IC (e.g., BGA) 31 having an under surface pad. An external shape of the auxiliary wiring package 33 is substantially the same as that of the IC 31. Further, connection pads for the IC 31 are not symmetrically arranged to pads for the auxiliary wiring package 33 (on both back and front sides of the circuit wiring board 32). Specifically, through holes formed through the circuit board 32 are deviated from the through holes of the auxiliary wiring package 33.

The circuit board 32 is now described in more detail.
  Number of layers: four
  Diameter of PAD: 0.6 mm
  Diameter of surface layer VIA land: 0.5 mm
  Diameter of inner layer VIA land: 0.76 mm Line width/Space 0.1 mm/0.1 mm
  Precision of solder registration position: ±0.075 mm The wiring auxiliary package 33 has a similar configuration to that of the printed circuit wiring board 32 except the auxiliary package 33 has six layers.

A detail of the IC 31 is as follows:
32 multiples 32 lines (1024 pins, Full-grid arrangement)
Pitch between pads: 1.27 mm Further, by using the first to third layers of the circuit board 32, two sides of the IC 31 (SGA) use an outside six lines, and its remaining two sides use an outside five lines among an outside six lines drawable through routes 34 originated from the IC 31 to the circuit board 32 (e.g., a number of drawings: 32×6×2+32×5×2−6×6−6×5×2−5×5=583 pins, with 441 pins remaining).

Figure 3:
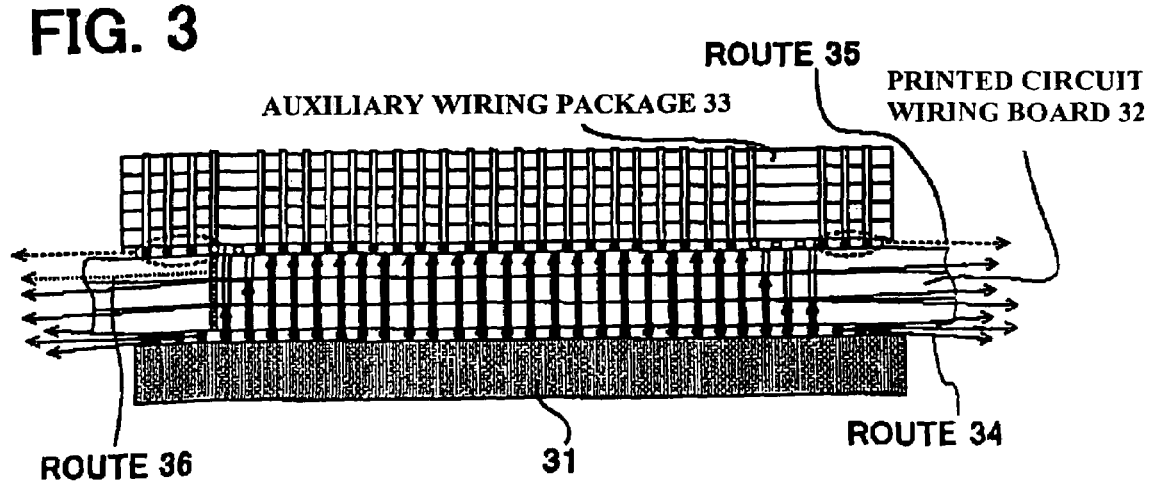
FIG. 3 is a cross sectional view illustrating a third embodiment of a layout on an auxiliary wiring package and a printed circuit wiring board.

Further, an upper layer of the circuit board 32 having the auxiliary package 33 mounted thereon is reserved for drawing lines from the auxiliary package 33 to the circuit board 32 as indicated by the dotted circles in FIG. 3.

Plural pads remaining on a center portion of the IC 31 amount to 441 pins (e.g., 32−6−5−21 signal lines: Full-grid). 21 central lines of 441 pins of the IC 31 are drawn to 21 central lines (e.g., 441 pins) of the auxiliary wiring package 33 through the VIAs of the circuit board 32. 18 central lines of 324-pins of the IC 31 are drawn to 18 central lines (e.g., 324-pins) of the auxiliary package 23 through the VIAs of the circuit board 32. The auxiliary wiring package 33 is arranged so as to be slightly deviated from a backside of the IC 31 by about a half of a PAD pitch.

From central to outside pads of the auxiliary package 33, eleven lines in one direction (e.g., total 22 lines: 484 pins) can be drawn using the first to sixth layers.

When 441-pins are to be drawn to the circuit board 32 using outside pads of the wiring auxiliary package 33, a shortage of 42 pins occurs if the two sides of the IC 31 include an outside three lines and the remaining two sides includes an outside three lines (e.g., a number of drawings: 32×4×2+32×3×2−4×4−4×3×2−3×3=399).

However, because the auxiliary wiring package 33 is arranged so as to be slightly deviated from the corresponding backside of the IC 31 by about a half of a pad pitch, plural VIAs can be arranged between pads in the two sides of the IC 31, and the outside 4 lines (i.e., three lines from the surface layer and one line from an immediate lower layer) can be drawn through the routes 36 in the two sides. In the remaining two sides, drawings of the outside three lines from the surface layer of the printed circuit wiring board 32 are also enabled.

As mentioned above, 982 signal pins among the total of 1024 signals pins can be drawn from the pads to an outside of the IC 31 through the routes 34 of the circuit board 32 and the routes 35 and 36 drawn from the circuit board 32 through the auxiliary package 33 (399-pins of the 21 central lines of the IC 31 among 441-pins are drawn through the auxiliary package 33). Thus, 42-pins cannot be drawn. However, a number of signal lines to be drawn can be suppressed by integrating VCC/GND or the like as a countermeasure. Further, a number of pins of the IC package can also be suppressed in light of a number of drawable pins as another countermeasure.

According to this embodiment, a layout can be readily understood, and a comprehensive wiring rule can be implemented. Further, when a general purpose wiring auxiliary package is used in accordance with an external shape and a number of pins formed on an electronic part having an under surface pad, the setting of the auxiliary package can be easily performed by the supplier as well as at user sites. Also, when a pitch between pads is small, for example, and as a result, a via hole cannot be arranged therebetween, a penetrating through hole can be utilized. Further, when the via hole can be arranged between the pads (which is a costly configuration), in which a connection pad is immediately formed on an opening of a through hole, can be avoided.

Figure 4:
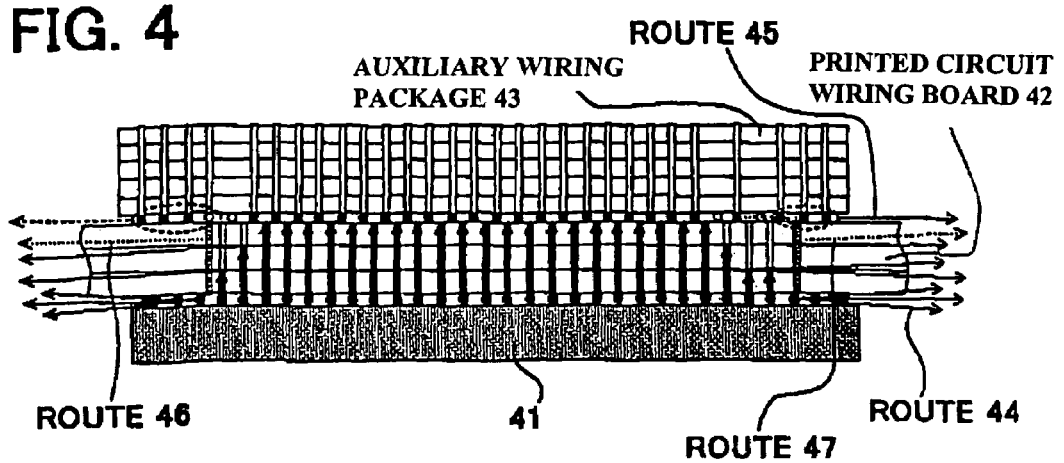
FIG. 4 is a cross sectional view illustrating a fourth embodiment of a layout of an auxiliary wiring package and a printed circuit wiring board.

A fourth embodiment of a wiring layout of an auxiliary package and a circuit board is now described with reference to FIG. 4. As shown, a circuit board 42 is sandwiched by an IC (e.g., BGA) 41 having an under surface pad, and an auxiliary package 43. Further, an outer shape of the auxiliary wiring package 43 is substantially the same as that of the IC 41. In addition, a plurality of connection pads for the IC 41 is not symmetrically arranged with a plurality of connection pads for the auxiliary package.

A construction of this embodiment is similar to that of the embodiment of FIG. 3. Accordingly, although 42-pins among 1024-pins cannot be drawn by the embodiment of FIG. 3, the wirings can be drawn in this embodiment by using a plurality of VIAs on routes 47 formed through the circuit board 42, for example. (In the case of "IVH", VIAs can be arranged on the routes 47 without a device for layout).

Further, drawing lines from the auxiliary wiring package 43 to the circuit board 42 through a route originated from the IC 41, and that originated from the IC 41 immediately to the printed circuit wiring board 42 can be achieved without interference. Specifically, at a boundary between a route originated from the IC 41 and passing through the auxiliary package 43, and another route originated from the IC 41 and detouring around the auxiliary package 43, drawing lines from the IC 41 and the auxiliary package 43 to the circuit board 42 is advantageously performed.

Further, when a via hole cannot be arranged between pads due to a small pitch between the pads, a penetrating through hole can be used. In contrast, when the via hole can be arranged between the pads, in which a connection pad is arranged on an opening of a through hole, can be avoided.

A fifth embodiment of a wiring layout on a wiring auxiliary package and a circuit wiring board is now described with reference to FIG. 5. As shown, a circuit board 52 is sandwiched by an IC (e.g., SGA) 51 having an under surface pad, and a wiring auxiliary package 53. Further, the auxiliary package 53 is smaller than the IC 51 and connection pads for IC 51 are not symmetrically arranged on both the back and front sides of the printed circuit wiring board 52 to connection pads for auxiliary package 53.

A construction of the circuit board 52 is as follows:
Number of Layers: Four
Diameter of PAD: 0.6 mm
Diameter of Surface layer VIA land: 0.5 mm
Diameter of inner layer VIA land: 0.76 mm
Line width/Space: 0.1 mm/0.1 mm
Precision of solder registration position: ±0.075 mm A configuration of the wiring auxiliary package 53 is similar to that of the printed circuit wiring board 52 except the auxiliary package 53 has two layers.

A configuration of an IC 51 is as follows:
24 multiples 24 lines (576 pins, Full-grid arrangement)
Pitch between pads: 1.27 mm Further, by using the first to third layers of the circuit board 52, an outside six lines can be drawn through routes 54 to the circuit board 52 from the IC 51 (e.g., the number of drawings by the outside six lines: 24×6×4+6×6×4−432 pins, with 144 pins remaining).

Figure 5:
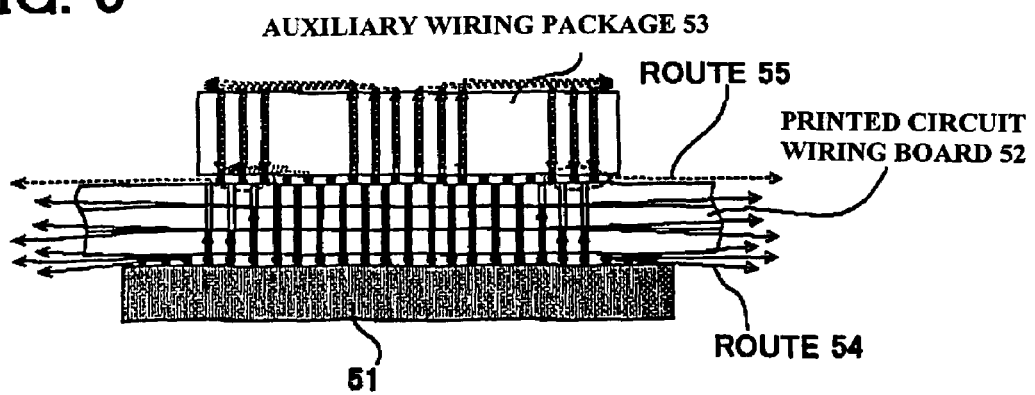
FIG. 5 is a cross sectional view illustrating a fifth embodiment of a layout on an auxiliary wiring package and a printed circuit wiring board.

Also, an upper layer of the circuit board 52 having the auxiliary package 53 mounted thereon is reserved for drawing wiring from the auxiliary package 53 to the circuit board 52 as shown by the dotted circles in FIG. 5.

Pads remaining at a center portion of the IC 51 amount to 144-pins (e.g. 24−6×2=12 lines: Full-grid). 144-pins of 12 central lines of the IC 51 are drawn to 12 central lines (e.g., 144-pins) of the auxiliary wiring package 53 through VIAs of the circuit board 52. The auxiliary package 53 is arranged so as to be slightly deviated from a corresponding backside of the IC 51 by about a half of a pad pitch.

From the central to the outside pads of the auxiliary package 53, six lines in one direction (i.e., total 12 lines: 144-pins) can be drawn using the first to second layers. When 144-pins are to be drawn to the circuit board 52 through the outside pads of the auxiliary package 53, an outside two lines (e.g., 18×2×2−2×2×2=64 pins) in two sides of the IC 51 and an outside three lines (18×3×2−3×3×2=90 pins) in the remaining two sides (i.e., total 154 pins) are enough. From the two sides, the outside three lines can be drawn using only a surface layer of the circuit board 52. From the remaining two sides, the outside two lines can be drawn using only a surface layer of the circuit board 52.

As mentioned above, the entire signals of 576-pins can be drawn from the pads to the outside of the IC 51 through routes 54 formed through the printed circuit wiring board 52, and route 55 starting from the circuit board 52 through the wiring auxiliary package 53 (IC 51 central 12 lines: 144 pins are drawn through the wiring auxiliary package 53).

According to this embodiment, the cost of the auxiliary package 53 can be reduced by minimizing its external size. Further, extra room for wiring and mounting parts on the circuit board is created. In addition, when a VIA hole cannot be arranged between pads, a penetrating through hole is used. In contrast, when the VIA hole can be arranged between the pads, a pad immediately arranged on an opening of a through hole can be avoided.

A sixth embodiment of a wiring layout on an auxiliary wiring package and a printed circuit wiring board is described with reference to FIG. 6. As shown, a circuit board 62 is sandwiched by a wiring auxiliary package 63 and an IC (e.g. BGA) 61 having a under face pad. The auxiliary wiring package 63 has substantially the same shape as that of the IC (e.g. BGA) 61.

A configuration of the circuit board 62 is as follows:
Number of Layers: Four
Diameter of PAD: 0.6 mm
Diameter of surface layer VIA land: 0.5 mm
Diameter of inner layer VIA land: 0.76 mm
Line width/Space: 0.1 mm/0.1 mm
Precision of solder registration position: ±0.075 mm A construction of the auxiliary wiring package 63 is similar to that of the circuit board 32, except the auxiliary package has six layers.

A construction of the IC 61 is as follows:
32 multiples 32 lines (i.e., 1024 pins, Full-grid arrangement)
Pitch between pads: 1.27 mm Further, using the first to third layers of the circuit board 62, an outside five lines among an outside six lines drawable from the IC 61 to the circuit board 62 through the route 64 are drawn (e.g., a number of drawings 32×5×4+5×5×4=540 pins, and 484 pins remaining). In addition, a layer of the circuit board 62 having the auxiliary wiring package 63 mounted thereon is reserved for drawing wires from the auxiliary package 63 to circuit board 62. Pads remaining at a center portion of the IC 61 amount to 484-pins (32−5×2=22 lines: Full-grid).

22 central lines of the IC 61 (i.e., 484 pins) are drawn to 22 central lines (i.e., 484 pine) of the auxiliary wiring package 63 through VIAs formed through the circuit board 62. Eleven lines in one direction can be drawn from the central portion to outside pads of the auxiliary package 63 by using the first to sixth layers (e.g., total 22 lines: 484 pins). When 484-pins are to be drawn to circuit board 62 through circumferential outside pads of the auxiliary package 63, a shortage of 36-pins occurs on the outside four lines (e.g., a number of wire drawings: 32×4×4−4×4−4=448).

Figure 6:
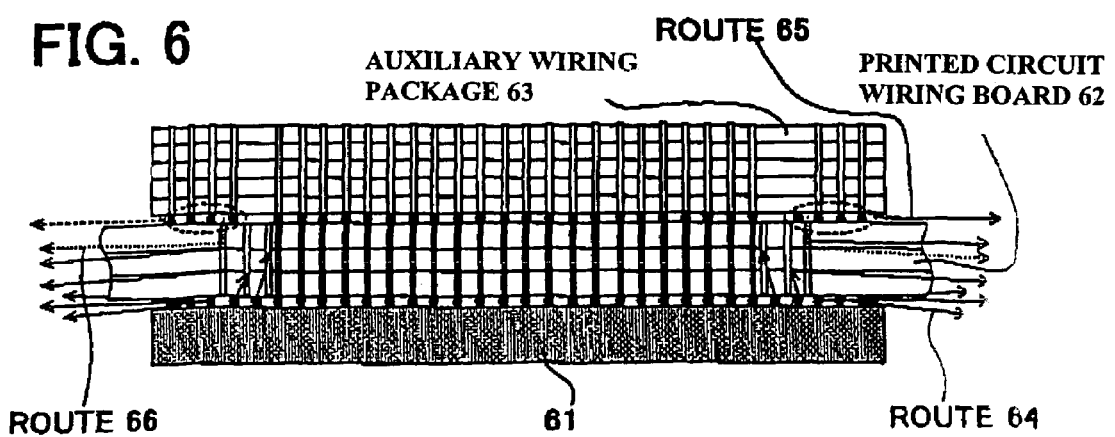
FIG. 6 is a cross sectional view illustrating a sixth embodiment of a layout on an auxiliary wiring package and a printed circuit wiring board.

Then, as illustrated in FIG. 6, the VIAs for wiring lines drawn from the IC 61 immediately to the circuit board 62 (i.e., detouring the auxiliary package 63) are arranged between the pads so as to be deviated. As a result, drawing from the outside 4-lines composed of three lines from the surface layer and one drawing line from a layer lower by one through the route 66 can be achieved.

As mentioned above, 982-signal pins among the entire 1024-signals pins can be drawn to an outside from the pads of the IC 31 through the routes 64 of the printed circuit wiring board 32, and the routes 65 and 66 starting from the circuit board 32 through the wiring auxiliary package 33 (e.g. IC 31 central 22 lines: 399 pins among 441 pins are drawn through the wiring auxiliary package 33). Thus, 36-pins cannot be drawn. However, a number of signals drawn can be decreased by integrating VCC/GND or the like as a countermeasure thereagainst, and a number of pins of the IC package can be suppressed in light of a number of drawable pins as another counter measure.

According to this embodiment, a layout can be easily understood, and a comprehensive wiring rule can be generated. Further, when a general purpose wiring auxiliary package is used in accordance with an external shape and a number of pins of an electronic part, setting of the package can be easily performed by both the supplier and the user.

A modification applicable to the embodiments described with reference to FIGS. 1 to 6 is now described. The printed circuit wiring board 12 is sandwiched by the auxiliary wiring package 13 and the electronic part (e.g. BGA) 11 having an under surface pad. A plurality of routes originated from the electronic part 11 down to the auxiliary wiring package 13 are formed by immediately arranging connection pads on openings of through holes. Another plurality of routes originated from the electronic part while detouring the wiring auxiliary package 13 are not formed by immediately arranging connection pads on openings of through holes as much as possible.

According to this embodiment, drawing wiring to the circuit board 12 from the wiring auxiliary package 13 through a route starting from the electronic part through the auxiliary package 13, and that starting from the electronic part to the circuit wiring board 12 can be achieved without their interference.

At a boundary between a route starting from the electronic part 11 and passing through the wiring auxiliary package 13 and that starting from the electronic part 11 and detouring the auxiliary package 13, drawing wiring from the electronic part and the auxiliary package to the wiring board can be advantageously performed.

Another modification applicable to the entire embodiments described with reference to FIGS. 1 to 6 is now described. Specifically, a conductor is applied all over a portion on each layer other than wiring lines. Accordingly, a ground can be intensified, and impedance control can be performed.

Yet, another modification applicable to the embodiments described with reference to FIGS. 1 to 6 is now described. Specifically, an interval is formed between a pad connecting an electronic part to a wiring auxiliary package and that connected by the wiring auxiliary package. According to this embodiment, drawing wiring from the auxiliary package immediately to the circuit board through a route starting from the electronic part through the auxiliary package, and that from the electronic part to the printed circuit wiring board can be achieved without their interference. At a boundary between a route staring from the electronic part and passing through the auxiliary package and another route starting from the electronic part and detouring the auxiliary package, drawing wiring from the electronic part and the auxiliary package drawn to circuit board can be advantageously performed.

Numerous additional modifications and variations of the present invention are possible in light of the above teachings. It is therefore to be understood that within the scope of the appended claims, the present invention may be practiced otherwise than as specifically described herein.

The invention claimed is:

1. An auxiliary wiring package to be mounted on one side of a printed circuit wiring board for performing auxiliary wiring from at least one electronic part to the circuit wiring board, the at least one electronic part mounted on the other side of the printed circuit wiring board, the printed circuit wiring board including a predetermined number of layers, which include a first half of the predetermined number of layers on a first side of a middle of the circuit wiring board in a direction perpendicular to a plane of a surface of the circuit wiring board and a second half of the predetermined number of layers on a second side of the middle of the circuit wiring board, and the auxiliary wiring package comprising:

a plurality of conductive layers configured to electrically connect i) through-signal lines passing through the circuit wiring board from the at least one electronic part to ii) layer-signal lines on each of the layers in the first half of the predetermined number of layers on the first side of the middle of the circuit wiring board, the layer-signal lines routed in a direction of the plane of the surface of the circuit wiring board; and a predetermined outer shape that substantially matches an outer shape of the at least one electronic part.

2. The auxiliary wiring package as claimed in claim 1, further comprising a pad connecting the at least one electronic part to the auxiliary wiring package, the pad is arranged at a greater distance from a center of the at least one electronic part than a corresponding pad on the at least one electronic part.

3. The auxiliary wiring package of claim 1, wherein the plurality of conductive layers are further configured to electrically connect i) the signal lines passing through the circuit wiring board from the at least one electronic part only to ii) signal lines on each of the layers in the first half of the predetermined number of layers on the first side of the middle of the circuit wiring board.

4. An auxiliary wiring package to be mounted on one side of a printed circuit wiring board for performing auxiliary wiring from at least one electronic part to the circuit wiring board, the at least one electronic part mounted on the other side of the printed circuit wiring board, the printed circuit wiring board including plural layers, and the auxiliary wiring package comprising:

a plurality of conductive layers configured to pass through-signal lines, which pass through the circuit wiring board from the at least one electronic part, only to surface-signal lines routed on a surface layer of the circuit wiring board, the surface-signal lines routed in a direction of a plane of the surface layer of the circuit wiring board; and a predetermined outer shape that substantially matches an outer shape of the at least one electronic part.

* * * * *